US010319783B2

(12) United States Patent
Briggs et al.

(10) Patent No.: US 10,319,783 B2
(45) Date of Patent: Jun. 11, 2019

(54) INTEGRATED MAGNETIC TUNNEL JUNCTION (MTJ) IN BACK END OF LINE (BEOL) INTERCONNECTS

(71) Applicant: INTERNATIONAL BUSINESS MACHINES CORPORATION, Armonk, NY (US)

(72) Inventors: Benjamin D. Briggs, Waterford, NY (US); Michael Rizzolo, Albany, NY (US); Theodorus E. Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/824,448

(22) Filed: Nov. 28, 2017

(65) Prior Publication Data
US 2018/0197915 A1 Jul. 12, 2018

Related U.S. Application Data

(63) Continuation of application No. 15/403,452, filed on Jan. 11, 2017, now Pat. No. 9,917,137.

(51) Int. Cl.
*H01L 27/22* (2006.01)
*H01L 43/12* (2006.01)
(Continued)

(52) U.S. Cl.
CPC ............ *H01L 27/222* (2013.01); *H01L 43/02* (2013.01); *H01L 43/08* (2013.01); *H01L 43/10* (2013.01);
(Continued)

(58) Field of Classification Search
CPC ....... H01L 27/222; H01L 43/12; H01L 43/02; H01L 43/08; H01L 21/0475;
(Continued)

(56) References Cited

U.S. PATENT DOCUMENTS 6,413,788 B1 7/2002 Tuttle
6,828,639 B2 12/2004 Nejad et al.
(Continued)

FOREIGN PATENT DOCUMENTS

CN 104518082 A 4/2015
EP 1 401 015 A1 3/2004
(Continued)

OTHER PUBLICATIONS

List of IBM Patents or Patent Applications Treated as Related dated Nov. 28, 2017, 2 pages.

*Primary Examiner* — Vu A Vu
(74) *Attorney, Agent, or Firm* — Tutunjian & Bitetto, P.C.; Vazken Alexanian

(57) ABSTRACT

A method is presented for forming a semiconductor structure. The method includes depositing a barrier layer, such as a tantalum nitride (TaN) layer, over a dielectric incorporating magnetic random access memory (MRAM) regions, forming magnetic tunnel junction (MTJ) stacks over portions of the TaN layer, patterning and encapsulating the MTJ stacks, forming spacers adjacent the MTJ stacks, and laterally etching sections of the TaN layer, after spacer formation, to form an electrode under the MTJ stacks. The electrode protects the MRAM regions. The electrode can be recessed from the spacers.

20 Claims, 11 Drawing Sheets

(51) Int. Cl.
   H01L 43/08    (2006.01)
   H01L 43/02    (2006.01)
   H01L 43/10    (2006.01)
   *H01L 21/8229*    (2006.01)
   *H01L 21/8239*    (2006.01)
   *H01L 21/04*      (2006.01)
   *H01L 27/112*     (2006.01)
   *H01L 21/67*      (2006.01)
   *H01L 21/02*      (2006.01)
   *H01L 21/3213*    (2006.01)
   *H01L 27/11502*   (2017.01)
   *H01L 27/105*     (2006.01)
   *H01L 27/11585*   (2017.01)
   *H01L 21/306*     (2006.01)
   *H01L 21/311*     (2006.01)

(52) U.S. Cl.
   CPC ........ H01L 43/12 (2013.01); *H01L 21/02019* (2013.01); *H01L 21/0475* (2013.01); *H01L 21/306* (2013.01); *H01L 21/311* (2013.01); *H01L 21/3213* (2013.01); *H01L 21/67063* (2013.01); *H01L 21/8229* (2013.01); *H01L 21/8239* (2013.01); *H01L 27/1052* (2013.01); *H01L 27/112* (2013.01); *H01L 27/11502* (2013.01); *H01L 27/11585* (2013.01); *H01L 2924/1441* (2013.01)

(58) Field of Classification Search
   CPC ........... H01L 21/3213; H01L 21/02019; H01L 21/67063; H01L 27/112; H01L 21/306; H01L 21/8239; H01L 21/8229; H01L 21/311; H01L 27/1052; H01L 27/11502

USPC .......................................................... 257/427
   See application file for complete search history.

(56) References Cited

U.S. PATENT DOCUMENTS 6,852,136  B2     2/2005   Park et al.
   6,939,795  B2     9/2005   Eissa et al.
   7,129,534  B2    10/2006   Tuttle
   7,727,778  B2 *   6/2010   Iwayama ............... B82Y 25/00
                                                     257/E21.665
   8,422,276  B2     4/2013   Yuan et al.
   8,674,465  B2     3/2014   Li et al.
   8,772,888  B2     7/2014   Jung et al.
   8,884,387  B2    11/2014   Assefa et al.
   9,012,322  B2     4/2015   Duoag et al.
   9,190,260  B1    11/2015   Zhang et al.
   9,318,694  B2     4/2016   Lamborn et al.
   9,349,939  B2 *   5/2016   Lu ........................... H01L 43/02
   2002/0119245 A1   8/2002   Verhaverbeke
   2006/0226122 A1  10/2006   Wojtczak et al.
   2015/0014800 A1   1/2015   Satoh et al.
   2015/0021725 A1   1/2015   Hsu et al.
   2015/0130065 A1   5/2015   Duong et al.
   2015/0255339 A1   9/2015   Zhang et al.
   2015/0325622 A1  11/2015   Zhang et al.
   2016/0181510 A1   6/2016   Ha et al.

FOREIGN PATENT DOCUMENTS

WO      2002/068717  A1     9/2002
   WO      2015/134206  A1    11/2015

* cited by examiner

INTEGRATED MAGNETIC TUNNEL JUNCTION (MTJ) IN BACK END OF LINE (BEOL) INTERCONNECTS

BACKGROUND

Technical Field

The present invention relates generally to semiconductor devices, and more specifically, to integrated magnetic tunnel junction (MTJ) in back end of line (BEOL) interconnects.

Description of the Related Art

Unlike conventional random access memory (RAM) chip technologies, magnetic RAM (MRAM) does not store data as electric charge, but instead stores data by magnetic polarization of storage elements. Typically, storage elements are formed from two ferromagnetic layers separated by a tunneling layer. One of the ferromagnetic layers has at least one pinned magnetic polarization (or fixed layer) set to a particular polarity. The magnetic polarity of the other ferromagnetic layer (or free layer) is altered to represent either a "1" (i.e., anti-parallel polarity to the fixed layer) or "0" (i.e., parallel polarity to the fixed layer). One device having a fixed layer, a tunneling layer, and a free layer is a magnetic tunnel junction (MTJ). The electrical resistance of a MTJ is dependent on the magnetic polarity of the free layer compared to the magnetic polarity of the fixed layer. A memory device such as MRAM can be built from an array of individually addressable MTJs.

SUMMARY

In accordance with an embodiment, a method is provided for forming a semiconductor structure. The method includes depositing a barrier layer, such as a tantalum nitride (TaN) layer, over a dielectric incorporating magnetic random access memory (MRAM) regions, forming magnetic tunnel junction (MTJ) stacks over portions of the TaN layer, patterning and encapsulating the MTJ stacks, forming spacers adjacent the MTJ stacks, and laterally etching sections of the TaN layer, after spacer formation, to form an electrode under the MTJ stacks.

In accordance with another embodiment, a semiconductor device is provided. The semiconductor device includes a barrier layer, such as a tantalum nitride (TaN) layer, deposited over a dielectric incorporating magnetic random access memory (MRAM) regions, magnetic tunnel junction (MTJ) stacks deposited over portions of the TaN layer, the MTJ stacks patterned and encapsulated, and spacers formed adjacent the MTJ stacks. The sections of the TaN layer are laterally etched to form an electrode under the MTJ stacks.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
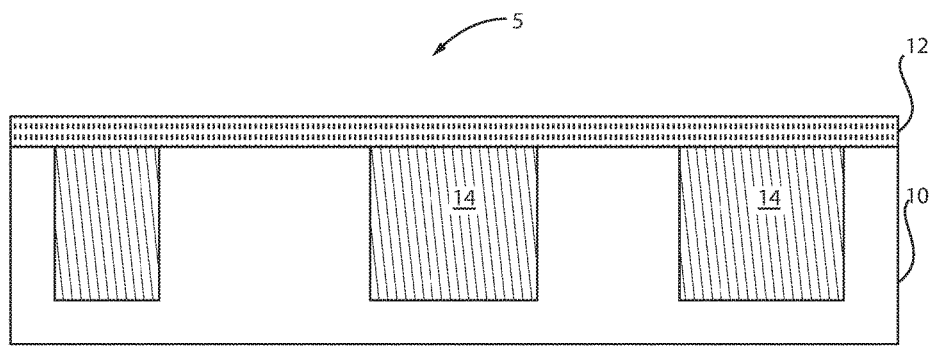
FIG. 1 is a cross-sectional view of a semiconductor structure including magnetic random access memory (MRAM) regions incorporated within a dielectric, in accordance with an embodiment of the present invention.

Embodiments of the present invention relate generally to a method for forming a semiconductor structure. The method includes depositing a tantalum nitride (TaN) layer over a dielectric incorporating magnetic random access memory (MRAM) regions, forming magnetic tunnel junction (MTJ) stacks over portions of the TaN layer, patterning and encapsulating the MTJ stacks, forming spacers adjacent the MTJ stacks, and laterally etching sections of the TaN layer, after spacer formation, to form an electrode under the MTJ stacks.

Moreover, embodiments of the present invention relate generally to a semiconductor device. The semiconductor device includes a tantalum nitride (TaN) layer deposited over a dielectric incorporating magnetic random access memory (MRAM) regions, magnetic tunnel junction (MTJ) stacks deposited over portions of the TaN layer, the MTJ stacks patterned and encapsulated, and spacers formed adjacent the MTJ stacks. Sections of the TaN layer are laterally etched to form an electrode under the MTJ stacks.

In one or more embodiments, the assembly of the semiconductor structure is started with a finished damascene level, which is planarized and finished with a barrier cap. MRAM regions are created, TaN and MTJ stacks are deposited, MTJs are patterned stopping on the TaN, and followed by encapsulation. Subsequently, spacer formation around the MTJ stacks is performed and lateral etching takes place to pull back the TaN below offset spacer, but still protect the MRAM regions.

In one or more embodiments, a structure and method to fabricate a MTJ pillar on a landing pad is presented. The MTJ is surrounded by an offset spacer and the metal below the MTJ is laterally etched, i.e., pulled back with respect to the spacer. The offset spacer can be a single material or multiple materials, and can also be L-shaped. If required for yield and reliability, for example, in case of copper (Cu) landing pads, the metal film below the MTJ is pulled back below the offset spacer, but the pull back is stopped prior to reaching the landing pad. If required for device performance, airgaps can be integrated into the process flow. Therefore, the structure and method protect the landing pads below the MTJ islands and minimize any sputtering/re-deposition onto the MTJ pillar through the use of an offset spacer and lateral etch. The process flow also requires less planarization and masking steps. The offset spacer and the lateral etch protect the landing pads and prevent re-deposition of metallic residues onto the MTJ pillar.

In one or more embodiments, the methods described herein protect the MTJ by only wet etching after the spacer is deposited, and using a wet etch tailored to remove TaN. Additionally, the methods described herein use a wet etch to open the bottom electrode after stopping IBE in the blanket bottom electrode TaN film.

In one or more embodiments, the bottom electrode protects the landing pads due to offset spacers, the bottom electrode is recessed from the spacer, wet etch for the bottom electrode does not leave metallic residues on the spacer (i.e., no shorting path between bitline and landing pads), and the landing pads and logic regions are protected during aggressive MTJ pillar etching.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

A "gate structure" means a structure used to control output current (i.e., flow of carriers in the channel) of a semiconducting device through electrical or magnetic fields.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, the terms "insulating" and "dielectric" denote a material having a room temperature conductivity of less than about $10^{-10}$ $(\Omega\text{-m})^{-1}$.

As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As used herein, an "anisotropic etch process" denotes a material removal process in which the etch rate in the direction normal to the surface to be etched is greater than in the direction parallel to the surface to be etched. The anisotropic etch can include reactive-ion etching (RIE).

Reactive ion etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used include ion beam etching, plasma etching or laser ablation.

The term "processing" as used herein includes deposition of material or photoresist, patterning, exposure, development, etching, cleaning, stripping, implanting, doping, stressing, layering, and/or removal of the material or photoresist as required in forming a described structure.

The terms "gas" and "gases" are used interchangeably, unless otherwise noted, and refer to one or more precursors, reactants, catalysts, carrier, purge, cleaning, combinations thereof, as well as any other fluid introduced into the chamber body.

The semiconductor devices described herein can be any type of device.

Exemplary types of semiconductor devices include planar field effect transistors (FETs), fin-type field effect transistors (FinFETs), nanowire/nanosheet devices, vertical field effect transistors (VFETs), or other devices.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

It is to be understood that the present invention will be described in terms of a given illustrative architecture; however, other architectures, structures, substrate materials and process features and steps/blocks can be varied within the scope of the present invention. It should be noted that certain features may not be shown in all figures for the sake of clarity. This is not intended to be interpreted as a limitation of any particular embodiment, or illustration, or scope of the claims.

FIG. 1 is a cross-sectional view of a semiconductor structure including magnetic random access memory (MRAM) regions incorporated within a dielectric, in accordance with an embodiment of the present invention.

A semiconductor structure 5 includes a semiconductor substrate 10. Magnetic random access memory (MRAM) regions 14 are formed within the semiconductor substrate 10. For example, two MRAM regions 14 are shown. A low-k barrier 12 (BLOk) is deposited over the top portion of the MRAM regions 14 and the top surface of the substrate 10. The top surface of the MRAM regions 14 is flush with the top surface of the substrate 10. The low-k barrier 12 can be, e.g., an n-type low-k barrier.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

The low-k CVD barrier film 12, designated BLOk, is engineered as an alternative to silicon nitride films. It is designed to reduce the dielectric constant (k) of copper damascene structures in order to achieve faster, more powerful devices. With a dielectric constant of less than 5, the film offers up to twice the etch selectivity of SiN, demonstrates leakage that is six to seven orders of magnitude better than conventional silicon carbide (SiC) material, and features good adhesion to other films. The amorphous film is composed of silicon (Si), carbon (C) and hydrogen (H).

MRAM regions 14 are a type of non-volatile computer memory that utilizes a Magnetic Tunneling Junction (MTJ) comprised of two ferromagnetic films, or plates, separated by a thin insulating layer to form magnetic storage elements. It will be recognized that the magnetic material can be any suitable material, combination of materials, or alloy that exhibits magnetic properties, such as a ferromagnetic material or a ferromagnetic thin film including CoFe, CoFeB, NiFe, etc. By sharing MRAM manufacturing processes with magnetic film integration techniques, the embodiments described herein are able to more efficiently provide integrated magnetic field enhanced circuit elements.

Figure 2:
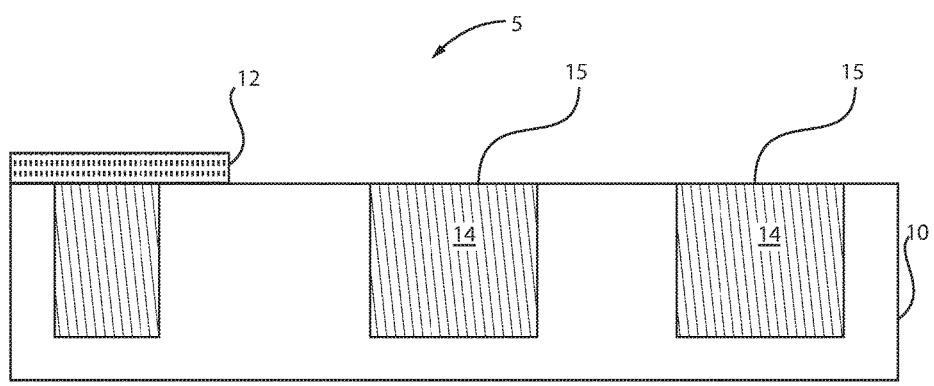
FIG. 2 is a cross-sectional view of the semiconductor structure of FIG. 1 where a top surface of a portion of the MRAM regions is exposed, in accordance with an embodiment of the present invention.

FIG. 2 is a cross-sectional view of the semiconductor structure of FIG. 1 where a top surface of a portion of the MRAM regions is exposed, in accordance with an embodiment of the present invention.

The low-k barrier 12 is etched to expose the top surface 15 of the MRAM regions 14. The low-k barrier 12 is etched such that a portion of the MRAM regions 14 are exposed. The lithography needed for this step can be a low cost mask with very large dimensions.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

Figure 3:
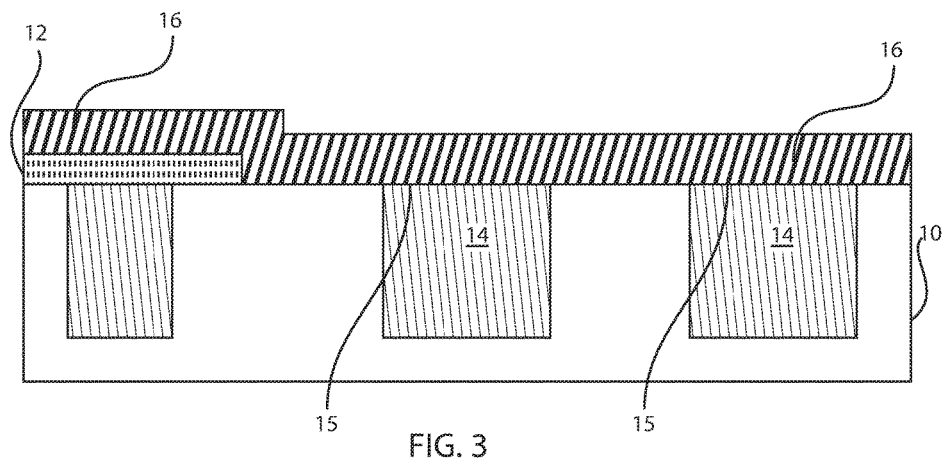
FIG. 3 is a cross-sectional view of the semiconductor device of FIG. 2 where a tantalum nitride (TaN) layer is deposited, in accordance with an embodiment of the present invention.

FIG. 3 is a cross-sectional view of the semiconductor device of FIG. 2 where a tantalum nitride (TaN) layer is deposited, in accordance with an embodiment of the present invention.

In various embodiments, a TaN layer 16 is deposited. The TaN layer 16 extends from one end of the substrate 10 to the other end of the substrate 10 such that the TaN layer 16 covers the BLOk 12, the top surface of the exposed substrate 10 and the top surface 15 of the MRAM regions 14. TaN layer 16 is about 0.5 to 3 nanometers thick and is a conformal coating. Since the molecular diameter of TaN is about 0.42 nanometers, TaN layer 16 comprises one to six monolayers.

The TaN layer 16 can be deposited via sputtering. As used herein, "sputtering" means a method of depositing a film of material on a semiconductor surface. A target of the desired material, i.e., source, is bombarded with particles, e.g., ions, which knock atoms from the target, and the dislodged target material deposits on the deposition surface. Examples of sputtering techniques include, but are not limited to, DC diode sputtering ("also referred to as DC sputtering"), radio frequency (RF) sputtering, magnetron sputtering, and ionized metal plasma (IMP) sputtering.

Examples of sputtering apparatus that can be suitable for depositing a p-type work function metal layer include DC diode type systems, radio frequency (RF) sputtering, magnetron sputtering, and ionized metal plasma (IMP) sputtering. In addition to physical vapor deposition (PVD) techniques, the p-type work function metal layer can also be formed using chemical vapor deposition (CVD) and atomic layer deposition (ALD).

Figure 4:
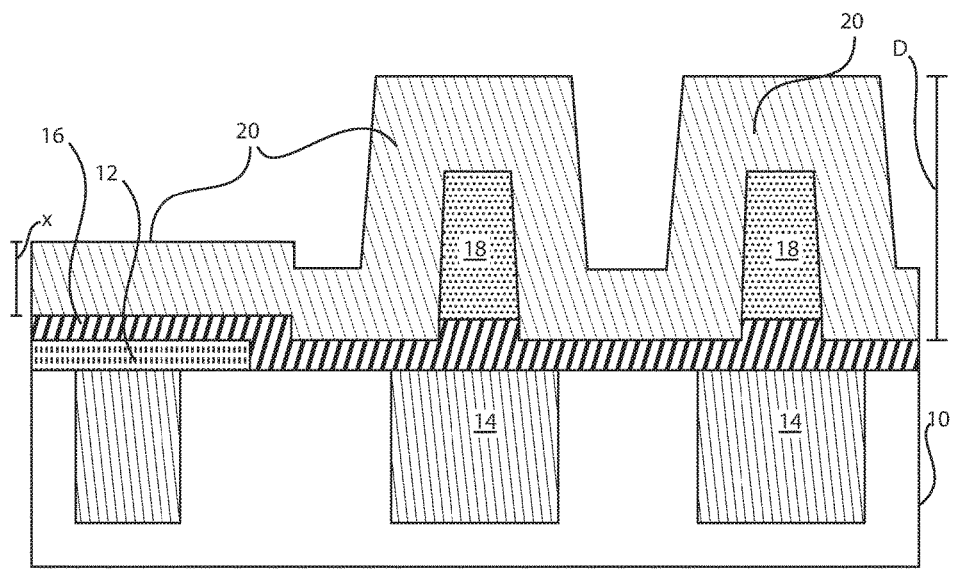
FIG. 4 is a cross-sectional view of the semiconductor device of FIG. 3 where magnetic tunnel junction (MTJ) stacks are formed over portions of the TaN layer, in accordance with an embodiment of the present invention.

FIG. 4 is a cross-sectional view of the semiconductor device of FIG. 3 where magnetic tunnel junction (MTJ) stacks are formed over portions of the TaN layer, in accordance with an embodiment of the present invention.

In various embodiments, MTJ stacks 18 are deposited over portions of the TaN layer 16. A SiN layer 20 can then be deposited over the MTJ stacks 18, as well as over the remaining TaN layer 16 portions. The MTJ stacks 18 are aligned with the MRAM regions 14. Stated differently, a longitudinal axis extends through a center point of the MTJ stacks 18 and the MRAM regions 14. The SiN layer 20 extends a distance X over the TaN layer 16 positioned over the low-k barrier 12, whereas the SiN layer 20 extends a distance D over the MTJ stacks 18.

In some embodiments, depositing the SiN layer 20 comprises exposing the metal nitride film to a first deposition gas and a second deposition gas, either simultaneously (e.g., CVD) or sequentially (e.g., ALD). The first deposition gas can comprise any suitable silicon-containing precursor and the second deposition gas can comprise any suitable reactive gas capable of reacting with the first deposition gas. In some embodiments, the first deposition gas comprises disilane and a second deposition gas comprises ammonia and exposing the plasma treated metal nitride film to the deposition gases forms a metal-SiN film.

The magnetic tunnel junction (MTJ) stacks 18 are each comprised of two layers of ferromagnetic material separated by a thin insulating tunnel barrier layer. The insulating layer is sufficiently thin that quantum-mechanical tunneling of the charge carriers occurs between the ferromagnetic electrodes. The tunneling process is electron spin dependent, which means that the tunneling current across the junction depends on the spin-dependent electronic properties of the ferromagnetic materials and is a function of the relative orientation of the magnetic moments (magnetization directions) of the two ferromagnetic layers. The two ferromagnetic layers are designed to have different responses to magnetic fields so that the relative orientation of their moments can be varied with an external magnetic field. The MTJ is usable as, e.g., a memory cell in a nonvolatile magnetic random access memory (MRAM) array, and as, e.g., a magnetic field sensor, such as a magnetoresistive read head in a magnetic recording disk drive.

MRAM is a type of solid state memory that uses tunneling magnetoresistance (TMR) to store information. MRAM is made up of an electrically connected array of magnetoresistive memory elements, referred to as magnetic tunnel junctions (MTJs). Each MTJ includes a free layer having a magnetization direction that is variable, and a fixed layer having a magnetization direction that is invariable. The free layer and fixed layer each include a layer of a magnetic material, and are separated by an insulating non-magnetic tunnel barrier. An MTJ stores information by switching the magnetization state of the free layer. When the magnetization direction of the free layer is parallel to the magnetization direction of the fixed layer, the MTJ is in a low resistance state. When the magnetization direction of the free layer is antiparallel to the magnetization direction of the fixed layer, the MTJ is in a high resistance state. The difference in resistance of the MTJ can be used to indicate a logical '1' or '0', thereby storing a bit of information. The TMR of an MTJ determines the difference in resistance between the high and low resistance states. A relatively high difference between the high and low resistance states facilitates read operations in the MRAM.

Figure 5:
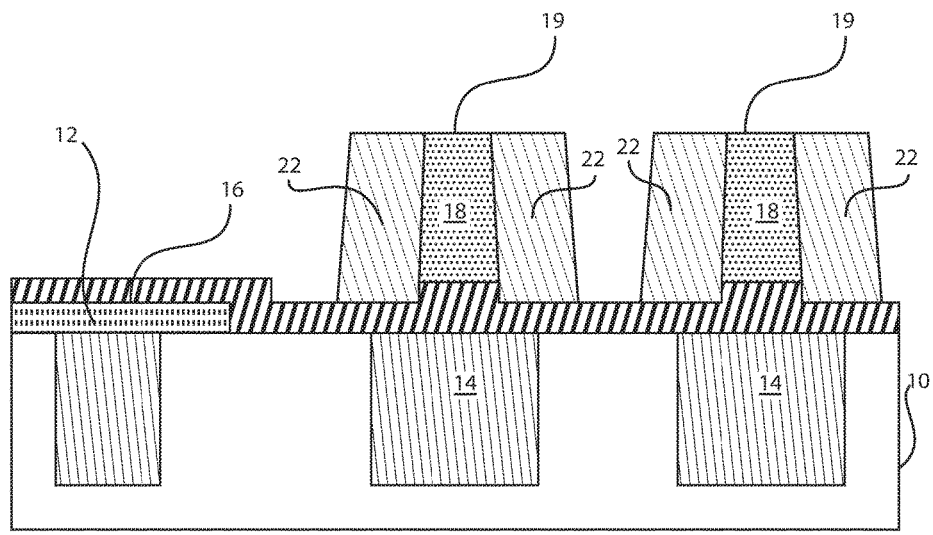
FIG. 5 is a cross-sectional view of the semiconductor device of FIG. 4 where a first etch is performed to create spacers adjacent the MTJ stacks, in accordance with an embodiment of the present invention.

FIG. 5 is a cross-sectional view of the semiconductor device of FIG. 4 where a first etch is performed to create spacers adjacent the MTJ stacks, in accordance with an embodiment of the present invention.

In various embodiments, the SiN layer 20 is etched such that spacers 22 are formed adjacent the MTJ stacks 18. The top surface 19 of the MTJ stacks 18 are exposed. The spacers 22 extend beyond a length of the MTJ stacks 18. The spacers 22 also have a thickness greater than the thickness of the MTJ stacks 18.

The spacers 22 can be formed by deposition followed by a directional etch (e.g., RIE). Spacers 22 can be formed along the sidewalls of the MTJ stacks 18. For example, spacer material such as a nitride (e.g., silicon nitride) can be deposited in a conventional manner, such as by chemical vapor deposition (CVD) or atomic layer deposition (ALD). Other techniques, which can be suitable for deposition of a nitride layer, include low-pressure CVD (LPCVD) and atmospheric pressure (CVD) (APCVD). Portions of the deposited nitride layer are subsequently etched away in a conventional manner to form the spacers 22. Spacer material can be silicon oxide, silicon oxynitride, silicon nitride, SiBCN, SiOCN, SiOC, or any suitable combination of those materials.

Figure 6:
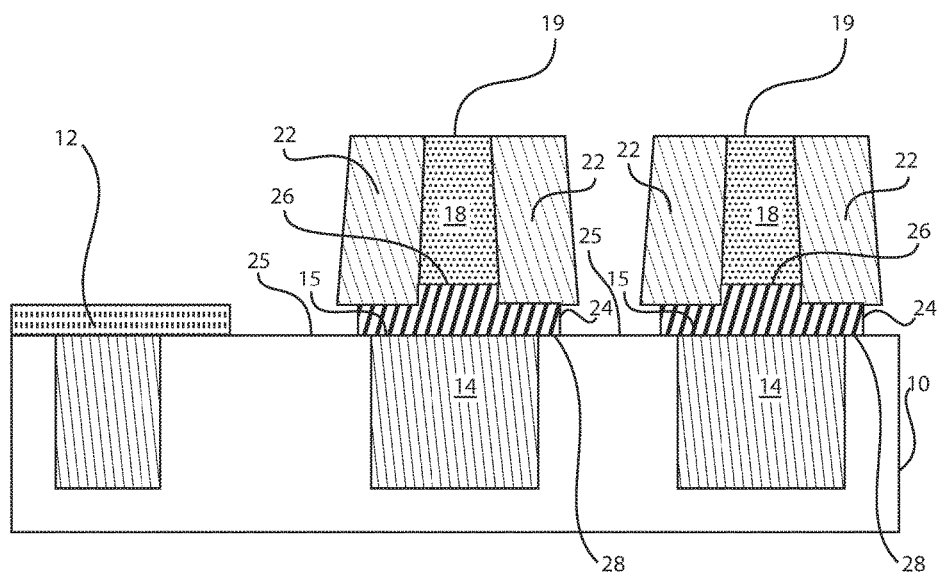
FIG. 6 is a cross-sectional view of the semiconductor device of FIG. 5 where a second etch is performed, the etch forming an electrode between each MRAM region and MTJ stack, in accordance with an embodiment of the present invention.

FIG. 6 is a cross-sectional view of the semiconductor device of FIG. 5 where a second etch is performed, the etch forming an electrode between each MRAM region and MTJ stack, in accordance with an embodiment of the present invention.

In various embodiments, an etch is performed to selectively remove portions of the TaN layer 16 such that electrodes 24 are formed between the MTJ stacks 18 and the MRAM regions 14. The electrode 24 has a top surface 26 and a bottom surface 28. The top surface 26 engages the MTJ stack 18 and the bottom surface 28 engages the top surface 15 of the MRAM region 14. The bottom surface 28 of the electrode 24 extends beyond a top surface 15 of the MRAM region 14. Thus, the length of the electrode 24 is greater than the length of the MRAM region 14. Stated differently, the MRAM regions 14 (or metal islands) are fully encapsulated by the TaN electrodes 24. The electrodes 24 fully block or cover the MRAM regions 14 such that the top surface 15 of the MRAM regions 14 is not exposed.

Additionally, the electrodes 24 are separated from each other by a distance designated by element 25. It is further noted that a bottom surface of the spacers 22 extends beyond the top surface 15 of the MRAM regions 14 and further extends beyond the bottom surface 28 of the electrodes 24.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

Figure 7:
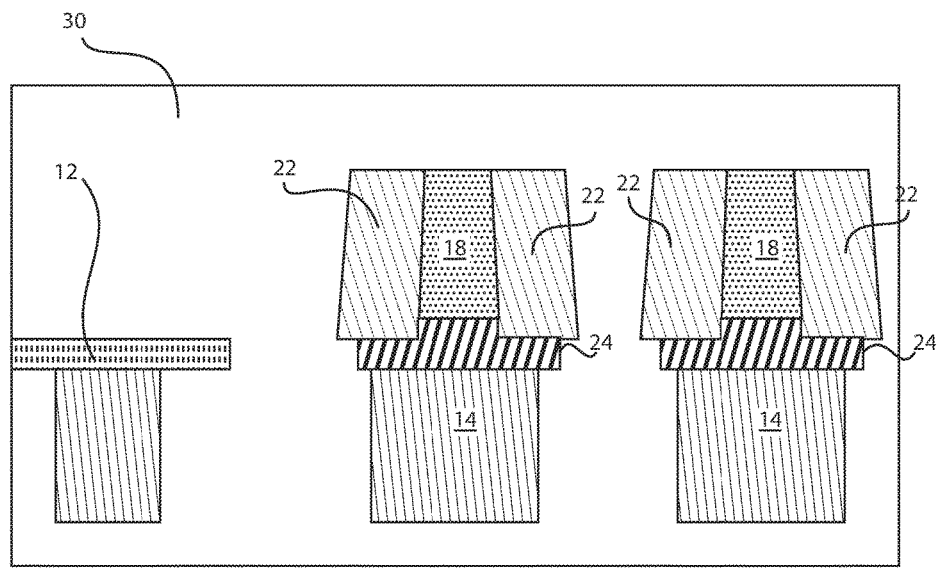
FIG. 7 is a cross-sectional view of the semiconductor device of FIG. 6 where dielectric deposition and planarization takes place, in accordance with an embodiment of the present invention.

FIG. 7 is a cross-sectional view of the semiconductor device of FIG. 6 where dielectric deposition and planarization takes place, in accordance with an embodiment of the present invention.

In various embodiments, an inter-layer dielectric (ILD) fill takes place. The ILD 30 is planarized. The ILD 30 encompasses or envelopes or surrounds the MTJ stacks 18. The ILD 30 engages an outer surface of the sidewall spacers 22. In one example embodiment, the ILD 30 extends over a top point of the spacers 22. Stated differently, the ILD 30 covers or encompasses or engulfs the spacers 22, as well as the exposed portions of the electrodes 24.

In one or more embodiments, the ILD 30 can have a thickness in the range of about 20 nm to about 150 nm, or in the range of about 30 nm to about 50 nm.

The ILD 30 can be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, $\alpha$-C:H). Additional choices for the ILD 30 include any of the aforementioned materials in porous form, or in a form that changes during processing to or from being porous and/or permeable to being non-porous and/or non-permeable.

In various embodiments, the height of the ILD 30 can be selectively reduced by chemical-mechanical polishing (CMP) and/or etching. Therefore, the planarization process can be provided by CMP. Other planarization process can include grinding and polishing.

Figure 8:
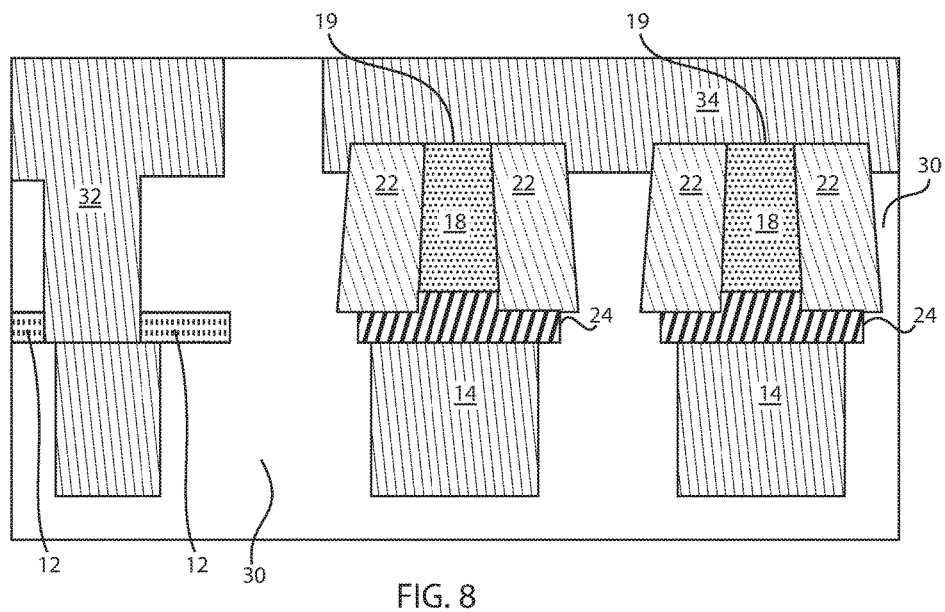
FIG. 8 is a cross-sectional view of the semiconductor device of FIG. 7 where damascene processing is performed, in accordance with an embodiment of the present invention.

FIG. 8 is a cross-sectional view of the semiconductor device of FIG. 7 where damascene processing is performed, in accordance with an embodiment of the present invention.

In various embodiments, damascene processing is performed where a via 32 is filled with a conducting material (e.g., a metal) and a trench 34 is filled with a conducting material (e.g., a metal). The via 32 extends up to the BLOk 12. The trench 34 extends over the MTJ stacks 18 such that the top surface 19 of each of the MTJ stacks 18 is exposed. The via 32 can be separated from the trench 34 by the ILD 30.

The damascene process is a process in which interconnect metal lines are delineated in dielectrics isolating them from each other, not by means of lithography and etching, but by means of chemical-mechanical planarization (CMP). In this process interconnect pattern is first lithographically defined in the layer of dielectric then metal is deposited to fill resulting trenches and then excess metal is removed by means of chemical-mechanical polishing (planarization).

The dual-damascene process is a modified version of the damascene process which is used to form metal interconnect geometry using CMP process instead of metal etching. In dual damascene, two interlayer dielectric patterning steps and one CMP step create a pattern which would require two patterning steps and two metal CMP steps when using conventional damascene process.

In this process, a thick coating of metal, such as copper that significantly overfills the trenches is deposited on the insulator, and CMP is used to remove the copper (known as overburden) that extends above the top of the insulating layer. Copper sunken within the trenches of the insulating layer is not removed and becomes the patterned conductor. Damascene processes generally form and fill a single feature with copper per Damascene stage. Dual-Damascene processes generally form and fill two features with copper at once, e.g., a trench overlying a via can both be filled with a single copper deposition using dual-Damascene.

Figure 9:
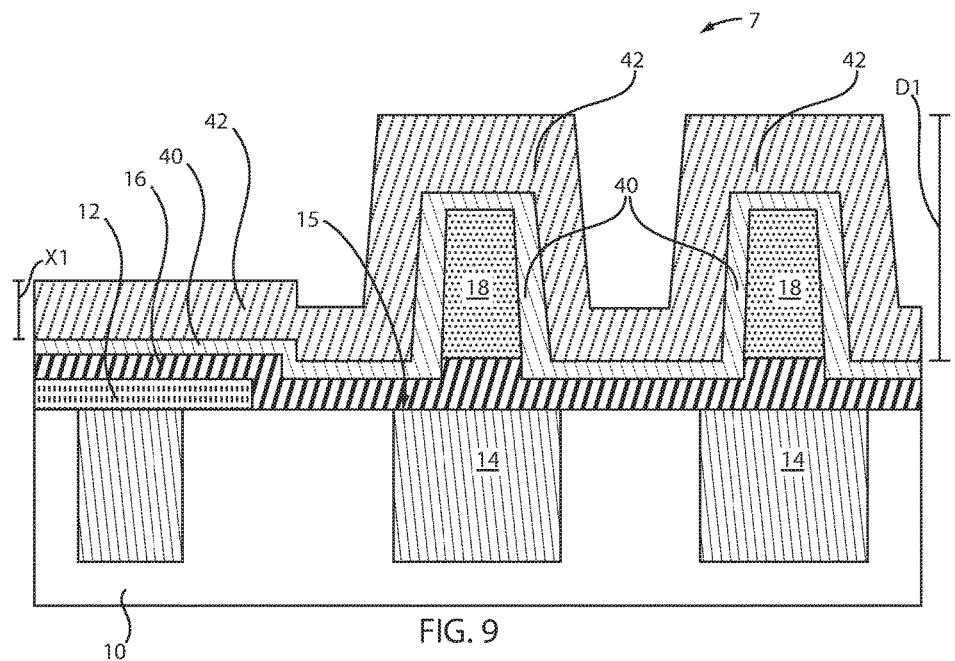
FIG. 9 is a cross-sectional view of the semiconductor device of FIG. 3 where a silicon nitride (SiN) layer and a low temperature oxide (LTO) layer are deposited over the MTJ stacks, in accordance with another embodiment of the present invention.

FIG. 9 is a cross-sectional view of the semiconductor device of FIG. 3 where a silicon nitride (SiN) layer and a low temperature oxide (LTO) layer are deposited over the MTJ stacks, in accordance with another embodiment of the present invention.

In various embodiments, an alternative flow can result in forming L-shaped spacers, as described with respect to FIGS. 9-14. A semiconductor structure 7 includes a semiconductor substrate 10. Magnetic random access memory (MRAM) regions 14 are formed within the semiconductor substrate 10. A low-k barrier 12 (BLOk) is deposited over the top portion of an MRAM region 14. A TaN layer 16 is deposited over the low-k barrier 12 and the remaining MRAM regions 14. MTJ stacks 18 are formed directly over the MRAM regions 14. A silicon nitride (SiN) layer 40 and a low temperature oxide (LTO) layer 42 are further deposited over the MTJ stacks 18. The SiN layer 40 is a thinner layer than that deposited in the structure of FIG. 4. The LTO layer 42 is thicker than the SiN layer 40. The LTO layer 42 extends a distance X1 over the TaN layer 16 positioned over the low-k barrier 12, whereas the LTO layer 42 extends a distance D1 over the MTJ stacks 18. The SiN layer 40 and the LTO 42 can form a dual liner encapsulation.

Figure 10:
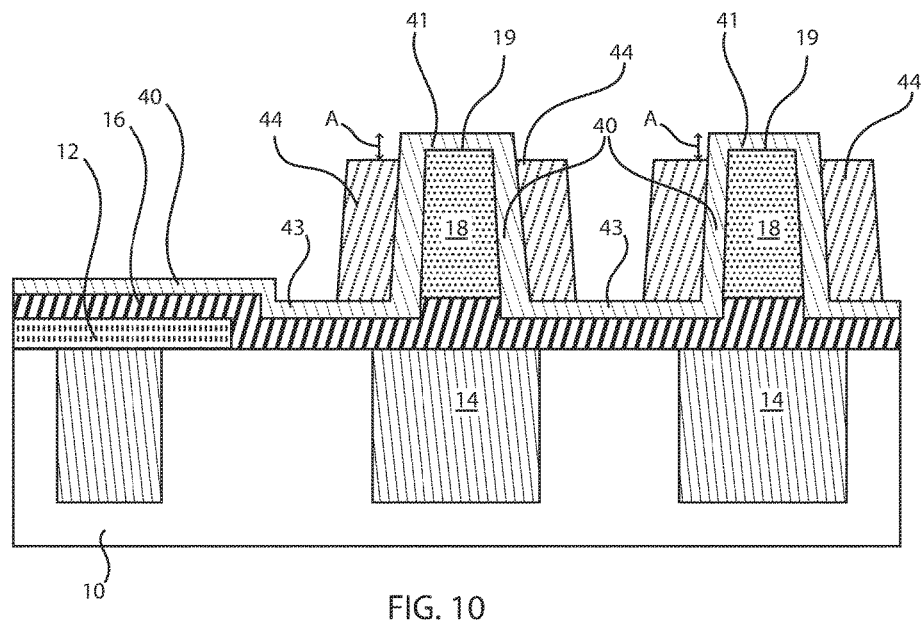
FIG. 10 is a cross-sectional view of the semiconductor device of FIG. 9 where a first etch is performed to create spacers adjacent the MTJ stacks, in accordance with an embodiment of the present invention.

FIG. 10 is a cross-sectional view of the semiconductor device of FIG. 9 where a first etch is performed to create spacers adjacent the MTJ stacks, in accordance with an embodiment of the present invention.

In various embodiments, a first etch occurs to form spacers 44 adjacent the MTJ stacks 18. The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist. The patterned photoresist can be removed utilizing an ashing process. In one example embodiment, RIE is performed.

The etching further results in a top portion 41 of the SiN layer 40 to be exposed at the top portion of the MTJ stacks 18. Additionally, the etching results in side portions 43 of the SiN layer 40 to be exposed adjacent the distal end of the spacers 44. Moreover, the spacers 44 are formed such that a height of the spacers is less than a height of the SiN layer 40 extending along a side surface of the MTJ stack 18. The height difference between the spacer 44 and the top portion 41 of the SiN layer 40 is designated as "A."

Figure 11:
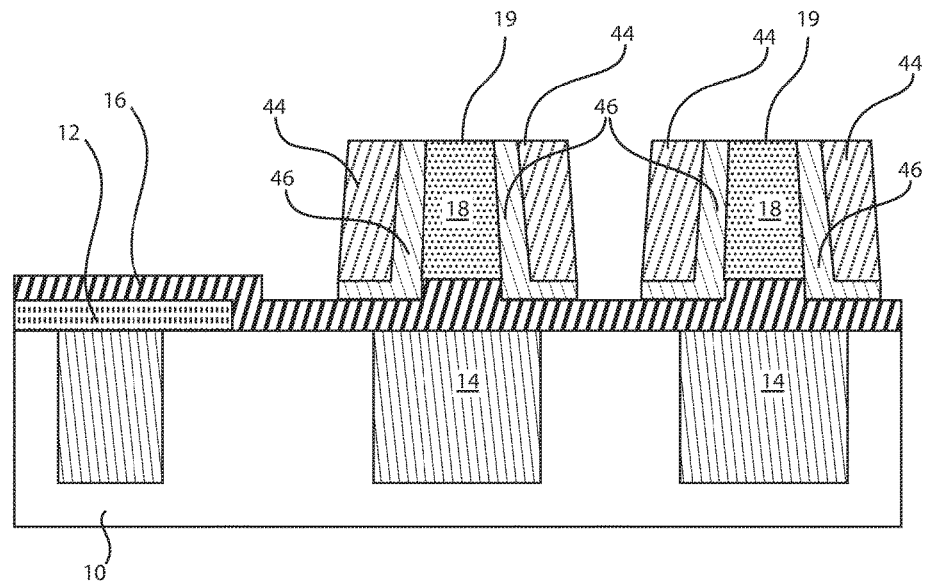
FIG. 11 is a cross-sectional view of the semiconductor device of FIG. 10 where a second etch is performed to remove certain SiN sections to form L-shaped spacers adjacent the MTJ stacks, in accordance with an embodiment of the present invention.

FIG. 11 is a cross-sectional view of the semiconductor device of FIG. 10 where a second etch is performed to remove certain SiN sections to form L-shaped spacers adjacent the MTJ stacks, in accordance with an embodiment of the present invention.

In various embodiments, a second etch occurs to remove the SiN layer 40, as well as the top portion 41 of the SiN layer 40 formed over the MTJ stacks 18 and the side portions 43 of the SiN layer 40 exposed adjacent the distal end of the spacers 44. Thus, the spacers 44 are now flush with the MTJ stacks 18. This results in L-shaped spacers 46 defined between each of the MTJ stacks 18 and the spacers 44. In particular, an L-shaped spacer 46 is formed on the right side of the MTJ stacks 18 and a backwards L-shaped spacer 46 is formed on the left side of the MTJ stacks 18.

Figure 12:
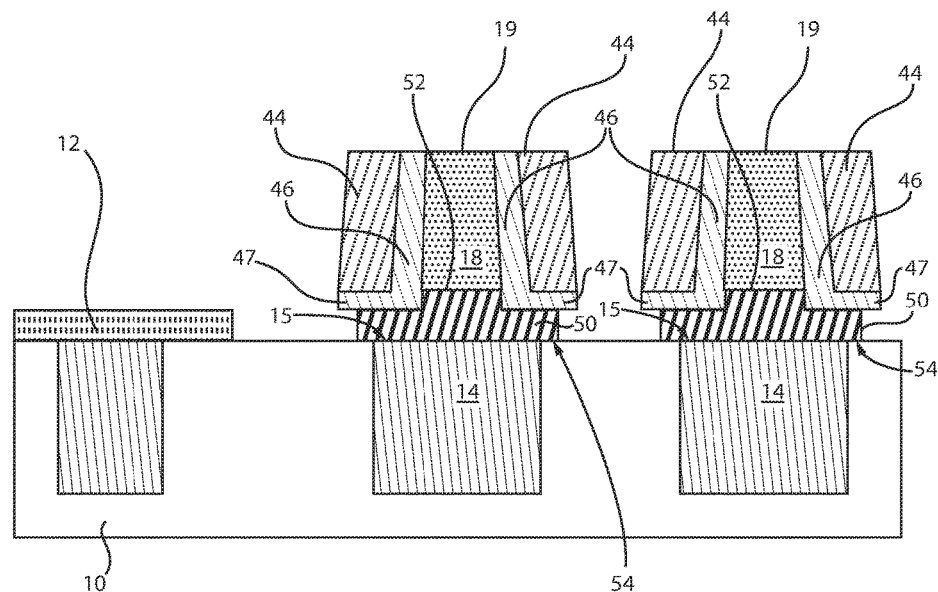
FIG. 12 is a cross-sectional view of the semiconductor device of FIG. 11 where a third etch is performed, the etch forming an electrode between each MRAM region and MTJ stack, in accordance with an embodiment of the present invention.

FIG. 12 is a cross-sectional view of the semiconductor device of FIG. 11 where a third etch is performed, the etch forming an electrode between each MRAM region and MTJ stack, in accordance with an embodiment of the present invention.

In various embodiments, an etch is performed to selectively remove portions of the TaN layer 16 such that electrodes 50 are formed between the MTJ stacks 18 and the MRAM regions 14. The electrode 50 has a top surface 52 and a bottom surface 54. The top surface 52 engages the MTJ stack 18 and the bottom surface 54 engages the top surface 15 of the MRAM region 14. The bottom surface 54 of the electrode 50 extends beyond a top surface 15 of the MRAM region 14. Thus, the length of the electrode 50 is greater than the length of the MRAM region 14. Stated differently, the MRAM regions 14 (or metal islands) are fully encapsulated by the TaN electrodes 50. The electrodes 50 fully block or cover the MRAM regions 14 such that the top surface 15 of the MRAM regions 14 is not exposed.

In contrast to FIG. 6, L-shaped SiN spacers 46 are formed between the spacers 44 and the MTJ stacks 18. Thus, a bottom surface 47 of the L-shaped spacers 46 extends beyond the top surface 15 of the MRAM regions 14 and further extends beyond the bottom surface 54 of the electrodes 50.

Figure 13:
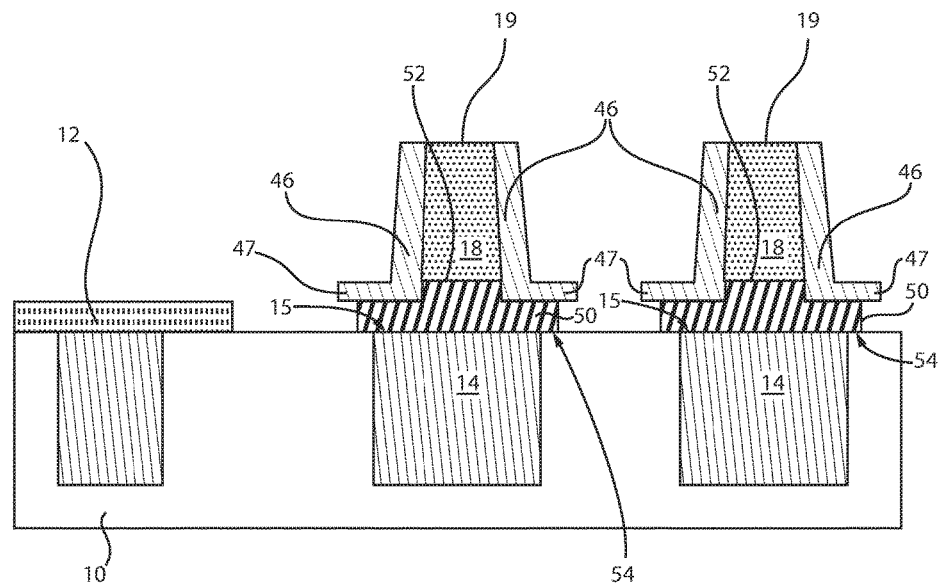
FIG. 13 is a cross-sectional view of the semiconductor device of FIG. 12 where the LTO layer is removed, in accordance with an embodiment of the present invention.

FIG. 13 is a cross-sectional view of the semiconductor device of FIG. 12 where the LTO layer is removed, in accordance with an embodiment of the present invention.

In various embodiments, a third etch can take place where the LTO spacers 44 are removed. It is noted that LTO removal is optional in the exemplary embodiments of the present invention.

Figure 14:
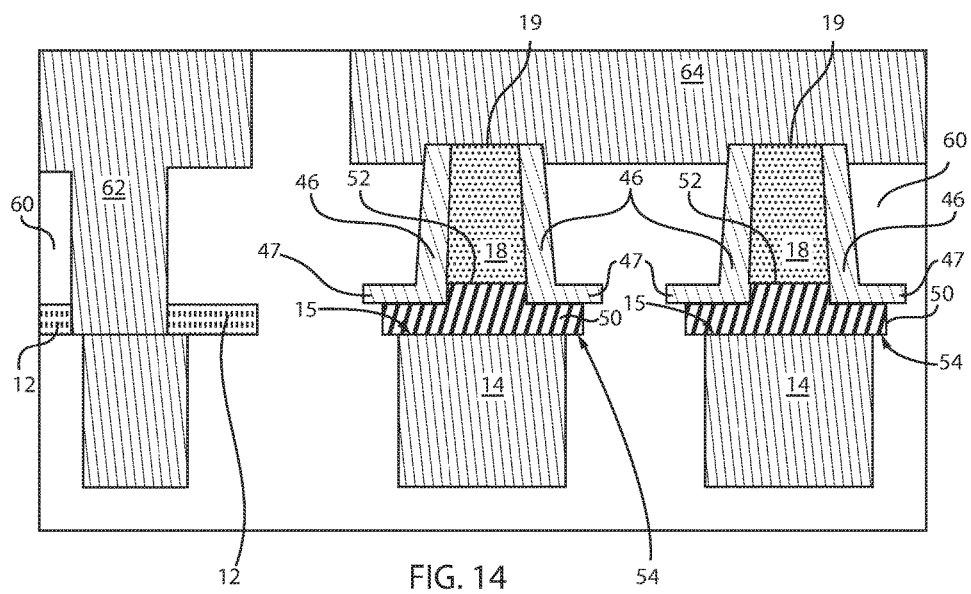
FIG. 14 is a cross-sectional view of the semiconductor device of FIG. 13 where dielectric deposition, planarization, and damascene processing is performed, in accordance with an embodiment of the present invention.

FIG. 14 is a cross-sectional view of the semiconductor device of FIG. 13 where dielectric deposition, planarization, and damascene processing is performed, in accordance with an embodiment of the present invention.

In various embodiments, an inter-layer dielectric (ILD) fill takes place. The ILD 60 is planarized. The ILD 60 encompasses or envelopes or surrounds the MTJ stacks 18. The ILD 60 engages an outer surface of the sidewall L-shaped spacers 46. In one example embodiment, the ILD 60 extends over a top point of the spacers 46. Stated differently, the ILD 60 covers or encompasses or engulfs the spacers 46, as well as the exposed portions of the electrodes 50.

In one or more embodiments, the ILD 60 can have a thickness in the range of about 20 nm to about 150 nm, or in the range of about 30 nm to about 50 nm.

In various embodiments, the height of the ILD 60 can be selectively reduced by chemical-mechanical polishing (CMP) and/or etching. Therefore, the planarization process can be provided by CMP. Other planarization process can include grinding and polishing.

Subsequently, in various embodiments, damascene processing is performed where a via 62 is filled with a conducting material (e.g., a metal) and a trench 64 is filled with a conducting material (e.g., a metal). The via 62 extends up to the BLOk 12. The trench 64 extends over the MTJ stacks 18 such that the top surface 19 of each of the MTJ stacks 18 is exposed. The via 62 can be separated from the trench 64 by the ILD 60.

Figure 15:
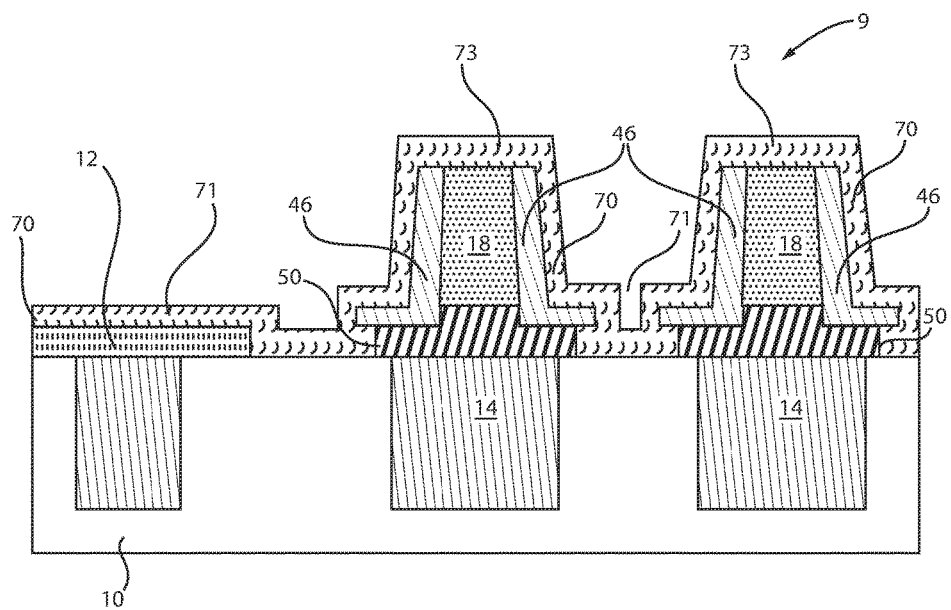
FIG. 15 is a cross-sectional view of the semiconductor device of FIG. 13 where a dielectric barrier is deposited, in accordance with another embodiment of the present invention.

FIG. 15 is a cross-sectional view of the semiconductor device of FIG. 13 where a dielectric barrier is deposited, in accordance with another embodiment of the present invention.

Figure 16:
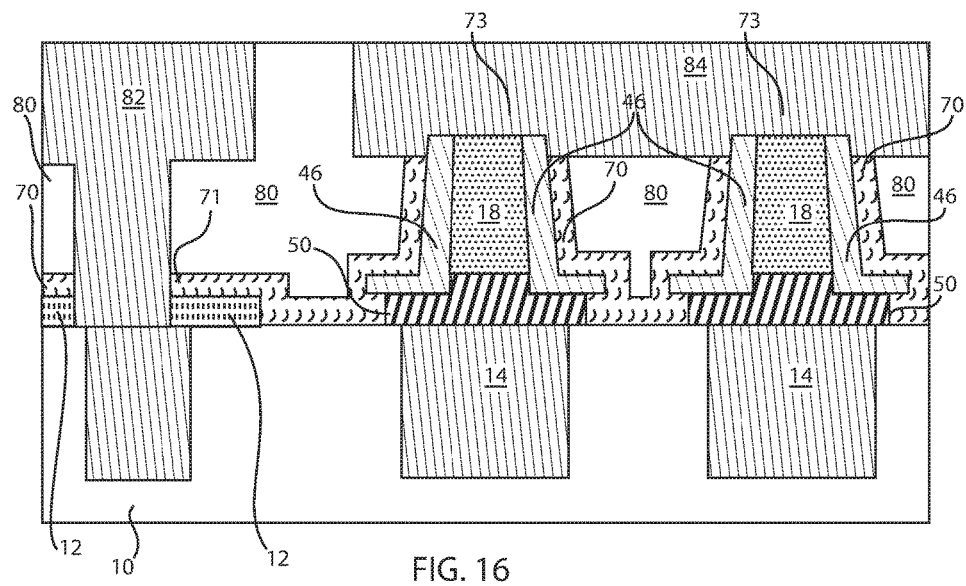
FIG. 16 is a cross-sectional view of the semiconductor device of FIG. 15 where dielectric deposition, planarization, and damascene processing is performed, in accordance with another embodiment of the present invention.

In various embodiments, an alternative flow can result in forming L-shaped spacers with an additional barrier cap, as described with respect to FIGS. 15-16. A semiconductor structure 9 includes a semiconductor substrate 10. Magnetic random access memory (MRAM) regions 14 are formed within the semiconductor substrate 10. A low-k barrier 12 (BLOk) is deposited over the top portion of an MRAM region 14. A TaN layer is deposited over the low-k barrier 12 and the remaining MRAM regions 14. MTJ stacks 18 are formed directly over the MRAM regions 14. The TaN layer is laterally etched to form electrodes 50 between the MTJ stacks 18 and the MRAM regions 14. L-shaped spacers 46 are formed adjacent the MTJ stacks 18, as described above.

A barrier cap 70 is further deposited over the MTJ stacks 18, as well as the rest of the structure 9. A top portion 73 of the barrier cap 70 is defined over the MTJ stacks 18, whereas side portions 71 of the barrier cap are defined over the low-k barrier 12 and between the MTJ stacks 18.

FIG. 16 is a cross-sectional view of the semiconductor device of FIG. 15 where dielectric deposition, planarization, and damascene processing is performed, in accordance with another embodiment of the present invention.

In various embodiments, an inter-layer dielectric (ILD) fill takes place. The ILD 80 is planarized. The ILD 80 encompasses or envelopes or surrounds the MTJ stacks 18. The ILD 80 engages an outer surface of the sidewall L-shaped spacers 46. In one example embodiment, the ILD 80 extends over a top point of the spacers 46. Stated differently, the ILD 80 covers or encompasses or engulfs the spacers 46, as well as the exposed portions of the electrodes 24.

In one or more embodiments, the ILD 80 can have a thickness in the range of about 20 nm to about 150 nm, or in the range of about 30 nm to about 50 nm.

In various embodiments, the height of the ILD 80 can be selectively reduced by chemical-mechanical polishing (CMP) and/or etching. Therefore, the planarization process can be provided by CMP. Other planarization process can include grinding and polishing.

Subsequently, in various embodiments, damascene processing is performed where a via 82 is filled with a conducting material (e.g., a metal) and a trench 84 is filled with a conducting material (e.g., a metal). The via 82 extends up to the BLOk 12. The trench 84 extends over the MTJ stacks 18 such that the top surface/portion 73 of the barrier cap 70 contacts the trench 84. The via 82 can be separated from the trench 84 by the ILD 80.

Figure 17:
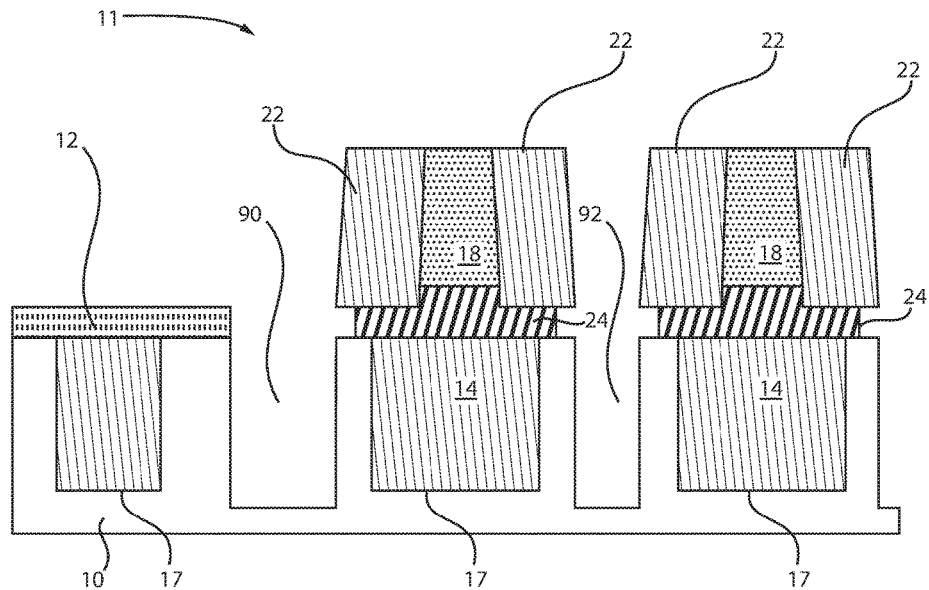
FIG. 17 is a cross-sectional view of the semiconductor device of FIG. 6 where airgaps or recesses are created within the dielectric, in accordance with another embodiment of the present invention.

FIG. 17 is a cross-sectional view of the semiconductor device of FIG. 6 where airgaps or recesses are created within the dielectric, in accordance with another embodiment of the present invention.

Figure 18:
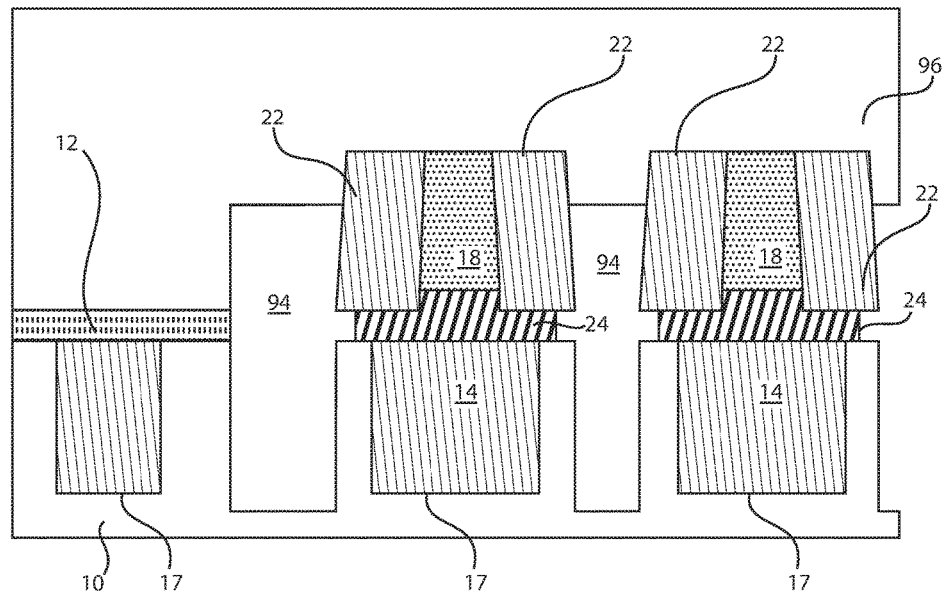
FIG. 18 is a cross-sectional view of the semiconductor device of FIG. 17 where dielectric deposition with pinch-off takes place, in accordance with an embodiment of the present invention.
Figure 19:
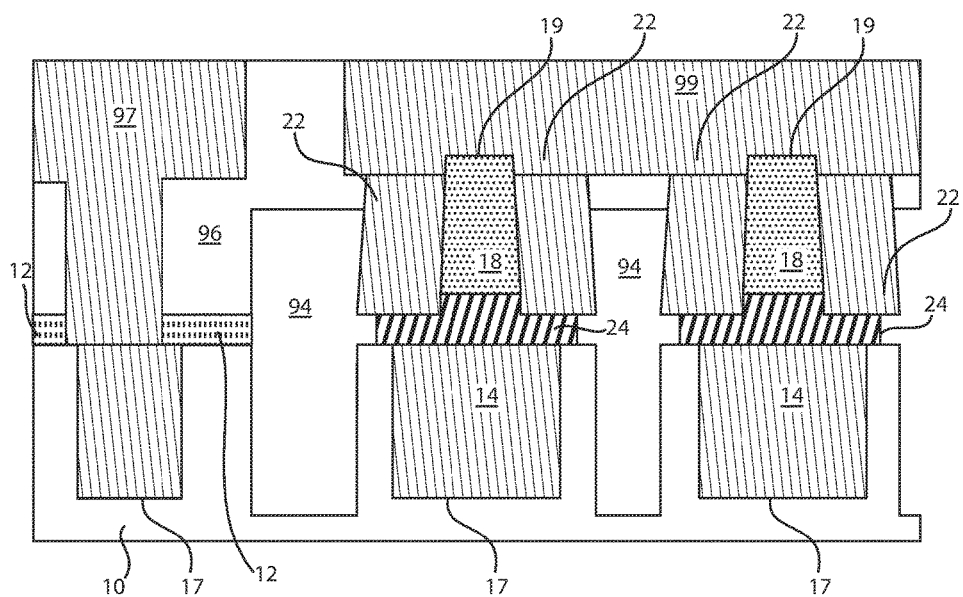
FIG. 19 is a cross-sectional view of the semiconductor device of FIG. 18 where damascene processing is performed, in accordance with an embodiment of the present invention.

In various embodiments, an alternative flow can result in forming spacers to reduce capacitive coupling, as described with respect to FIGS. 17-19. A semiconductor structure 11 includes a semiconductor substrate 10. Magnetic random access memory (MRAM) regions 14 are formed within the semiconductor substrate 10. A low-k barrier 12 (BLOk) is deposited over the top portion of an MRAM region 14. A TaN layer is deposited over the low-k barrier 12 and the remaining MRAM regions 14. MTJ stacks 18 are formed directly over the MRAM regions 14. The TaN layer is laterally etched to form electrodes 24 between the MTJ stacks 18 and the MRAM regions 14. Spacers 22 are formed adjacent the MTJ stacks 18, as described above.

A first recess or cavity 90 is formed between the MRAM region positioned directly under the low-k barrier 12 and the MTJ stack 18, whereas a second recess or cavity 92 is formed between the MTJ stacks 18. The first and second recesses or cavities 90, 92 extend beyond a depth of the MRAM regions 14. The first and second recesses or cavities 90, 92 can be equal to each other. In another example embodiment, the first and second recesses or cavities 90, 92 are not equal to each other. For example, recess 90 can be bigger or wider than recess 92, as shown for illustrative purposes.

FIG. 18 is a cross-sectional view of the semiconductor device of FIG. 17 where dielectric deposition with pinch-off takes place, in accordance with an embodiment of the present invention.

In various embodiments, an inter-layer dielectric (ILD) fill takes place. The ILD 96 is planarized. The ILD 96 encompasses or envelopes or surrounds the MTJ stacks 18. The ILD 96 engages a portion of an outer surface of the sidewall spacers 22. In one example embodiment, the recesses 90, 92 aid in the creation of airgaps 94. The airgaps 94 are formed such that the sidewalls of the electrodes 24 are exposed. The airgaps 94 extend a length of the spacers 22, the length being less than the total length of the sidewall of the spacer 22.

In one or more embodiments, the ILD 96 can have a thickness in the range of about 20 nm to about 150 nm, or in the range of about 30 nm to about 50 nm.

In various embodiments, the height of the ILD 96 can be selectively reduced by chemical-mechanical polishing (CMP) and/or etching. Therefore, the planarization process can be provided by CMP. Other planarization process can include grinding and polishing.

FIG. 19 is a cross-sectional view of the semiconductor device of FIG. 18 where damascene processing is performed, in accordance with an embodiment of the present invention.

In various embodiments, damascene processing is performed where a via 97 is filled with a conducting material (e.g., a metal) and a trench 99 is filled with a conducting material (e.g., a metal). The via 97 extends up to the BLOk 12. The trench 99 extends over the MTJ stacks 18 such that the top surface 19 of each of the MTJ stacks 18 is exposed. The via 97 can be separated from the trench 99 by the ILD 96. The sidewalls of the electrodes 24 are also exposed after damascene processing is performed due to the formation of the airgaps 94.

Figure 20:
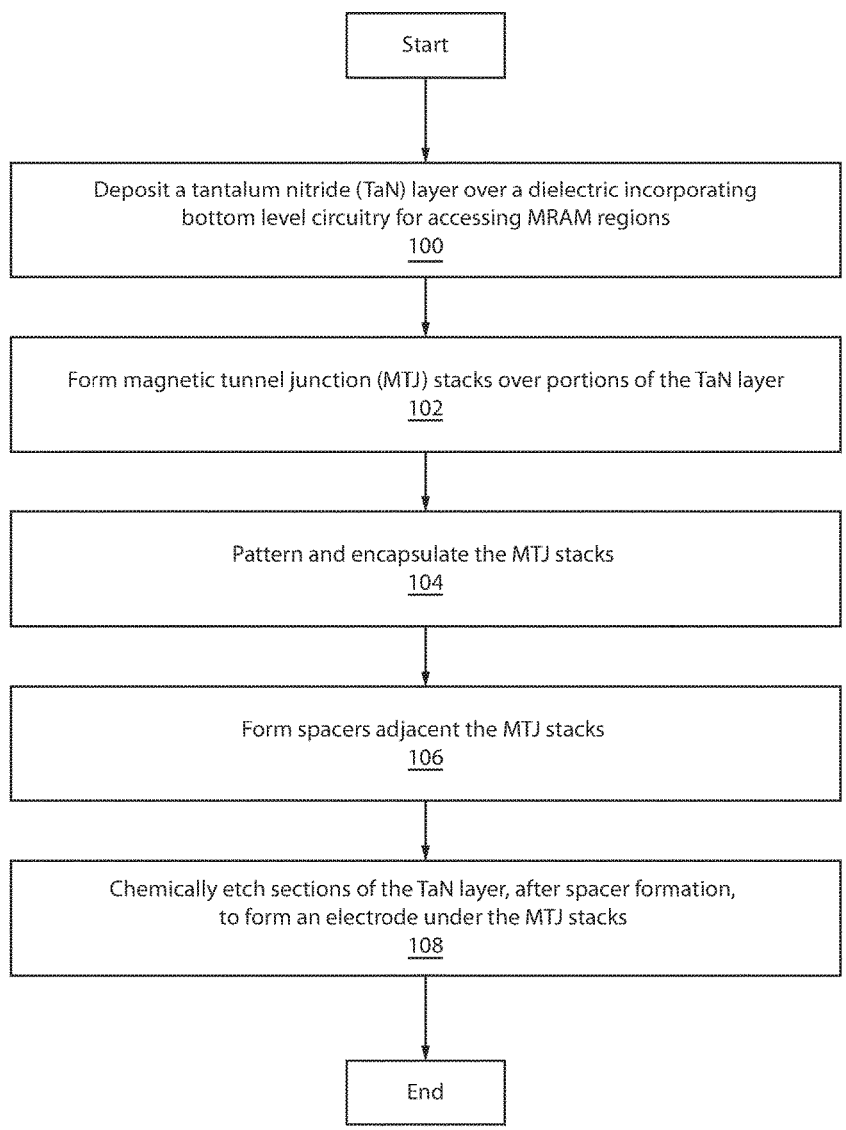
FIG. 20 is a block/flow diagram of an exemplary method for forming a semiconductor device, in accordance with an embodiment of the present invention.

FIG. 20 is a block/flow diagram of an exemplary method for forming a semiconductor device, in accordance with an embodiment of the present invention.

At block 100, a barrier layer, such as a tantalum nitride (TaN) layer, is deposited over a dielectric incorporating magnetic random access memory (MRAM) regions.

At block 102, magnetic tunnel junction (MTJ) stacks are formed over portions of the TaN layer.

At block 104, the MTJ stacks are patterned and encapsulated.

At block 106, spacers are formed adjacent the MTJ stacks.

At block 108, sections of the TaN layer are laterally etched, after spacer formation, to form an electrode under the MTJ stacks.

The integrated magnetic tunnel junctions (MTJs) of the exemplary embodiments of the present disclosure are formed in back end of line (BEOL) interconnects. Concerning BEOL, a layer of dielectric material is blanket deposited atop the entire substrate and planarized. The blanket dielectric can be selected from the group consisting of silicon-containing materials such as $SiO_2$, $Si_3N_4$, SiOxNy, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, a-C:H). Additional choices for the blanket dielectric include: any of the aforementioned materials in porous form, or in a form that changes during processing to or from being porous and/or permeable to being non-porous and/or non-permeable.

The blanket dielectric can be formed by various methods well known to those skilled in the art, including, but not limited to: spinning from solution, spraying from solution, chemical vapor deposition (CVD), plasma enhanced CVD (PECVD), sputter deposition, reactive sputter deposition, ion-beam deposition, and evaporation.

The deposited dielectric is then patterned and etched to forth via holes to the various source/drain and gate conductor regions of the substrate. Following via formation interconnects are formed by depositing a conductive metal into the via holes using conventional processing, such as CVD or plating. The conductive metal can include, but is not limited to: tungsten, copper, aluminum, silver, gold, and alloys thereof. The BEOL layer can comprise one or multiple stacks of wires/vias.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated for reducing parasitic back gate capacitance (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor structure, the method comprising:
   depositing a barrier layer over an insulating layer incorporating magnetic random access memory (MRAM) regions;
   forming magnetic tunnel junction (MTJ) stacks aligned with one or more of the MRAM regions;
   forming a first dielectric layer covering the MTJ stacks;
   forming a second dielectric layer over the first dielectric layer;
   etching the second dielectric layer to form a first set of spacers adjacent the MTJ stacks;

removing exposed portions of the first dielectric layer to define a second set of L-shaped spacers directly contacting the first set of spacers; and laterally etching sections of the barrier layer, after first and second spacer formation, to form electrodes directly contacting the MTJ stacks.

2. The method of claim 1, further comprising patterning and encapsulating the MTJ stacks before forming the first and second set of spacers.

3. The method of claim 1, further comprising having the electrodes directly contact the MTJ stacks above the barrier layer.

4. The method of claim 1, further comprising having the electrodes directly contact the MRAM regions below the barrier layer.

5. The method of claim 1, wherein the first dielectric layer is a nitride layer and the second dielectric layer is an oxide layer.

6. The method of claim 5, wherein the second dielectric layer has a thickness greater than a thickness of the first dielectric layer.

7. The method of claim 1, wherein the electrodes contact an entire upper surface of their respective MRAM regions.

8. The method of claim 1, wherein the electrodes are recessed from their respective first and second sets of spacers.

9. The method of claim 1, wherein the barrier layer is a tantalum nitride (TaN) layer.

10. The method of claim 1, further comprising creating airgaps via dielectric deposition with pinch-off to reduce capacitive coupling.

11. A semiconductor structure comprising:
a barrier layer deposited over an insulating layer incorporating magnetic random access memory (MRAM) regions;
magnetic tunnel junction (MTJ) stacks aligned with one or more of the MRAM regions;
a first dielectric layer covering the MTJ stacks;
a second dielectric layer formed over the first dielectric layer;
a first set of spacers formed adjacent the MTJ stacks by etching the second dielectric layer; and
a second set of L-shaped spacers defined by removing exposed portions of the first dielectric layer;
wherein sections of the barrier layer are laterally etched, after first and second spacer formation, to form electrodes directly contacting the MTJ stacks.

12. The structure of claim 11, wherein the MTJ stacks are patterned and encapsulated before forming the first and second set of spacers.

13. The structure of claim 11, wherein the electrodes directly contact the MTJ stacks above the barrier layer.

14. The structure of claim 11, wherein the electrodes directly contact the MRAM regions below the barrier layer.

15. The structure of claim 11, wherein the first dielectric layer is a nitride layer and the second dielectric layer is an oxide layer.

16. The structure of claim 15, wherein the second dielectric layer has a thickness greater than a thickness of the first dielectric layer.

17. The structure of claim 11, wherein the electrodes contact an entire upper surface of their respective MRAM regions.

18. The structure of claim 11, wherein the electrodes are recessed from their respective first and second sets of spacers.

19. The structure of claim 11, wherein the barrier layer is a tantalum nitride (TaN) layer.

20. The structure of claim 11, wherein airgaps are created via dielectric deposition with pinch-off to reduce capacitive coupling.

* * * * *